(12) United States Patent
Czornomaz et al.

(10) Patent No.: US 10,395,732 B2
(45) Date of Patent: Aug. 27, 2019

(54) RESISTIVE MEMORY APPARATUS USING VARIABLE-RESISTANCE CHANNELS WITH HIGH- AND LOW-RESISTANCE REGIONS

(71) Applicant: International Business Machines Corporation, Armonk, NY (US)

(72) Inventors: Lukas Czornomaz, Zurich (CH); Veeresh Vidyadhar Deshpande, Zurich (CH); Vara Sudananda Prasad Jonnalagadda, Wadenswil (CH); Wabe Koelmans, Adliswil (CH); Abu Sebastian, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/970,989

(22) Filed: May 4, 2018

(65) Prior Publication Data

US 2018/0254083 A1    Sep. 6, 2018

Related U.S. Application Data

(63) Continuation of application No. 15/278,603, filed on Sep. 28, 2016, now Pat. No. 10,037,800.

(51) Int. Cl.
*G11C 11/56* (2006.01)
*G11C 13/00* (2006.01)

(52) U.S. Cl.
CPC ...... *G11C 13/0004* (2013.01); *G11C 11/5678* (2013.01); *G11C 13/003* (2013.01); *G11C 13/004* (2013.01); *G11C 13/0069* (2013.01); *G11C 2213/15* (2013.01); *G11C 2213/17* (2013.01); *G11C 2213/18* (2013.01); *G11C 2213/75* (2013.01); *G11C 2213/76* (2013.01)

(58) Field of Classification Search
CPC .............. G11C 13/0004; G11C 13/003; G11C 11/5678; G11C 13/0069; G11C 13/004; G11C 2213/76; G11C 2213/75; G11C 2213/18; G11C 2213/17; G11C 2213/15

See application file for complete search history.

(56) References Cited

U.S. PATENT DOCUMENTS

| | | | |
|---|---|---|---|
| 9,570,169 B1 * | 2/2017 | Czornomaz | G11C 13/004 |
| 2011/0235408 A1 | 9/2011 | Minemura et al. | |
| 2013/0328005 A1 | 12/2013 | Shin et al. | |

(Continued)

*Primary Examiner* — Jerome Leboeuf
(74) *Attorney, Agent, or Firm* — Harrington & Smith (57) ABSTRACT

Apparatus including: memory cell unit(s) having a variable-resistance channel component (CC) extending between first and second supply terminals for supplying read and write (R/W) signals to the unit in respective R/W modes, and resistive memory elements (RMEs) arranged along the CC, RME includes resistive memory material (RMM), extending along a respective channel segment (CHS) of the CC in contact therewith, in which respective lengths along that CHS of high- and low-resistance regions is variable in write mode, and a gate terminal provided on that CHS for controlling resistance of the CHS in response to control signal(s) (CS) applied to the gate terminal; and circuitry configured to apply the CS such that, in read mode, a RME(s) is selected by applying a CS producing CHS with resistance between the resistance regions of the RMM; and remaining RME(s) are deselected by applying CS producing CHS having resistance less than the low-resistance region.

18 Claims, 6 Drawing Sheets

(56) References Cited

U.S. PATENT DOCUMENTS

| | | |
|---|---|---|
| 2014/0146612 A1 | 5/2014 | Helm et al. |
| 2014/0198553 A1 | 7/2014 | Lung |
| 2014/0218999 A1 | 8/2014 | Sasago et al. |
| 2014/0369113 A1 | 12/2014 | Krebs et al. |
| 2014/0369114 A1* | 12/2014 | Kim ................. H01L 45/06 365/163 |
| 2016/0078932 A1* | 3/2016 | Sasago ............... G11C 13/0004 365/51 |

* cited by examiner

RESISTIVE MEMORY APPARATUS USING VARIABLE-RESISTANCE CHANNELS WITH HIGH- AND LOW-RESISTANCE REGIONS

CROSS-REFERENCE TO RELATED APPLICATION

This application is a continuation of U.S. patent application Ser. No. 15/278,603, filed Sep. 28, 2016, the disclosure of which is hereby incorporated by reference in its entirety.

BACKGROUND

The present invention relates generally to resistive memory apparatus, and more particularly to apparatus comprising one or more memory cell units containing a plurality of resistive memory elements in which a resistive memory material is used for information storage.

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section.

Resistive memory cells such as phase-change memory (PCM) cells use a resistive memory material for storage of information. The resistance of such cells can be programmed via a programming (or "write") operation that changes the relative proportions of high- and low-resistance regions of the resistive memory material of the cell. The resulting cell-resistance can be measured in a subsequent "read" operation to determine the programmed cell-state. In a PCM cell, for example, the relative proportions of a (high-resistance) amorphous phase and a (low-resistance) crystalline phase of a chalcogenide material disposed between terminals of the cell can be varied by application of control signals to the cell terminals. The relative proportions of the amorphous and crystalline regions of the cell material resulting from programming can be controlled via the applied signals.

In single-level memory devices, cells can be set to one of two states, a high-resistance "RESET" state and a low-resistance "SET" state, permitting storage of one bit per cell. Multilevel devices exploit additional, intermediate states, corresponding to differing proportions of the high- and low-resistance regions within the cell volume. In PCM cells, for example, the RESET state corresponds to a substantially amorphous state of the PCM material. The SET state corresponds to a substantially crystalline PCM material. The additional programming states for multilevel operation correspond to different sizes of the amorphous region within the otherwise-crystalline cell volume. Since the two material phases exhibit a large resistance contrast, varying the size of the amorphous region within the overall cell volume produces a corresponding variation in cell-resistance. The cell-resistance, and hence programmed cell-state, can be read at any time by applying a low-voltage signal to the cell terminals and measuring the resulting "read current" flowing through the cell. The signal level for the read operation is sufficiently low that the read operation does not disturb the programmed cell-state.

There are currently efforts to develop 3D (three-dimensional) resistive memory architectures in which two-dimensional arrays of resistive memory cells are layered one above the other to produce an integrated 3D memory structure. An example of such a memory structure is described in U.S. Pat. No. 8,169,819 B2. Such memory architectures offer the potential for significantly higher storage capacity and areal efficiency. Most of the 3D efforts are still at the development stage and are based on a BEOL (back end of line) process to define the memory architecture in which individual cells can be written/read. It is widely believed that such BEOL-compatible 3D efforts cannot lead to a significant number of memory layers (e.g. >5 layers) due to challenges associated with microfabrication as well as difficulties associated with addressing individual devices. Moreover, for reliable operation, prior devices are restricted to storing 1-bit per cell because resistive memory cells are subject to resistance variations such as resistance drift over time drift, substantial flicker noise, and resistance that varies with ambient temperature. These effects, which are largely attributable to the high-resistance regions of the resistive memory material of cells, cause resistance measurements for different cell-states to vary with time in a stochastic manner. Such effects inhibit reliable readback for multilevel operation where the resistance levels of different cell-states are more closely packed, and therefore harder to distinguish in the presence of stochastic resistance variations. These problems present a significant challenge in the drive to increase storage densities and areal efficiency of resistive memory devices.

Improvements in resistive memory devices would be highly desirable.

BRIEF SUMMARY

According to an embodiment of the invention, an apparatus is provided, including at least one memory cell unit comprising: a variable-resistance channel component extending between first and second supply terminals for supplying read and write signals to the memory cell unit in respective read and write modes, and a plurality of resistive memory elements arranged along the channel component, wherein each memory element comprises a resistive memory material, extending along a respective segment of the channel component in contact therewith, in which respective lengths along that channel segment of high- and low-resistance regions of the material is variable in said write mode, and a gate terminal provided on that channel segment for controlling resistance of the channel segment in response to control signals applied to the gate terminal; and control circuitry configured to apply said control signals to the gate and supply terminals in said read and write modes, the control circuitry configured such that, in the read mode, at least one memory element is selected by applying to that element a said control signal which produces a channel segment having a resistance between that of said high- and low-resistance regions of the resistive memory material of the element, and any remaining memory element is deselected by applying to that element a said control signal which produces a channel segment having a resistance less than that of said low-resistance region of the resistive memory material of the element.

Embodiments of the invention will be described in more detail below, by way of illustrative and non-limiting example, with reference to the accompanying drawings.

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

In the resistive memory apparatus of the following examples, the resistive memory elements are based on PCM cells. The variable-resistance properties of PCM cells arise from heating a volume of phase-change material (typically a chalcogenide compound such as GST (Germanium-Antimony-Tellurium)), disposed between the cell terminals so as to change the relative proportions of a (high-resistance) amorphous phase and a (low-resistance) crystalline phase in the chalcogenide volume. (It will be appreciated that the terms "high-resistance" and "low-resistance" are used herein as comparative terms only and no particular constraints are implied as to specific resistance values). If a voltage less than a certain threshold switching voltage is applied via the cell terminals, the current will be so small that there will be very little Joule heating and substantially no phase change in the cell volume. However, if a programming ("write") signal above the threshold voltage is applied, cell resistance drops to a very low value during application of the signal through the phenomenon of electronic threshold switching. This enables flow of a large current which results in significant Joule heating and subsequent phase change. The relative proportions of the amorphous and crystalline regions in the cell volume can be varied by controlling characteristics (e.g. amplitude, duration, power) of signals applied to the cell. The overall electrical resistance of the cell can thus be set to desired programming levels, corresponding to different relative proportions of amorphous/crystalline material, by controlling the applied signals. In the (substantially amorphous) RESET state, resistance of the cell is very high. By heating to a temperature above its crystallization point and then cooling, the phase-change material can be transformed into the (substantially-crystalline) low-resistance SET state. The cell can be programmed to various intermediate states by heating the PCM material to an appropriate temperature to induce a desired cell-state on cooling. If the cell is heated to a high temperature, above the melting point of the PCM material, the material reverts to the fully-amorphous RESET state on rapid cooling. Reading of PCM cells is performed using cell resistance as a metric for cell-state, whereby different resistance values (typically ranges of values) correspond to different programming levels. Cell resistance can be determined in a read operation by applying a low-voltage signal to the cell terminals and measuring the resulting current flow through the cell. The signal level for the read operation is below the switching threshold of the PCM material so that the read operation does not disturb the programmed cell-state.

Figure 1:
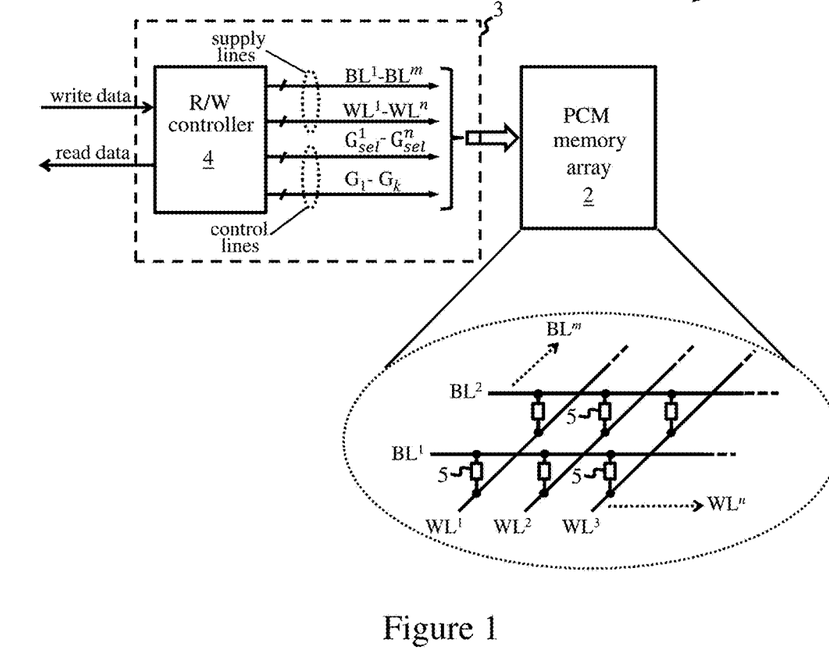
FIG. 1 is a schematic block diagram of resistive memory apparatus embodying the invention.

A resistive memory apparatus is illustrated schematically in FIG. 1 in accordance with exemplary embodiments. The apparatus 1 comprises a memory array 2 and control circuitry, indicated generally at 3, for controlling operation of memory array 2. The memory array 2 comprises an integrated array of PCM cell units, each containing a plurality of memory elements, described in detail below. The control circuitry 3 comprises a read/write (R/W) controller 4 and a plurality of sets of interconnect lines connecting the R/W controller to PCM cell units of memory array 2. R/W controller 4 receives write data to be written to array 2 in a write mode, and outputs data read from array 2 in a read mode. As described in detail below, R/W controller 4 is operable to generate signals for controlling read/write operations in the array, and to supply these signals to the appropriate interconnects for addressing particular memory elements in the PCM cell units. The R/W controller 4 also performs the read measurements for determining cell-state in read operations in the usual manner.

As indicated schematically in the enlargement, the PCM cell units 5 of memory array 2 are arranged in m rows and n columns of an m-by-n array. The interconnects with R/W controller 4 include a set of bit lines $BL^1$-$BL^m$ which are connected to PCM cell units in respective rows of the array, and a set of word lines $WL^1$-$WL^n$ which are connected to PCM cell units in respective columns of the array. Each cell unit 5 is thus connected between a respective pair of bit and word lines at the intersection thereof. Additional control lines (not shown in the enlargement) are connected to components of the cell units 5 as detailed below.

The bit lines $BL^i$ (i=1 to m) and word lines $WL^j$ (j=1 to n) provide the supply lines for supplying read and write signals from R/W controller 4 to the cell units 5 in operation. The interconnects with R/W controller 4 also include sets of control lines $G_{sel}^1$ to $G_{sel}^n$ and $G_1$ to $G_k$. The control lines $G_{sel}^j$ (j=1 to n) are connected to access devices, described below, of cell units 5 in respective columns j of the memory array. These control lines provide word-line select signals from R/W controller 4 to select cell units 5 for read/write operations. The control lines $G_1$ to $G_k$ are connected to respective memory elements of the plurality k of memory elements in each cell unit. These control lines provide control signals from R/W controller 4 for controlling read/write operations of memory elements as detailed below.

R/W controller 4 can be implemented in various ways to generate signals as described below, apply these signals to the appropriate interconnects to address memory elements for read/write operations, and to detect programmed cell-states from current measurements in read operations in the usual manner. The functionality described can be implemented using standard techniques and circuit components as will be apparent to those skilled in the art. The particular implementation details are orthogonal to the operation to be described. However, R/W controller 4 may be implemented by one or more modules performing functions of signal generation, address control and read measurement, and/or may comprise a plurality of such modules controlling different portions of memory array 2. In general, functionality may be implemented by one or more processors and/or digital or analog circuit components, and specific functions may be implemented by hardware, software, or a combination thereof R/W controller 4 may be integrated with memory array 2 on a single memory chip. However, the memory apparatus 1 may in general be implemented on one or more chips, and may comprise one or more memory arrays 2 controlled by one or more R/W controllers 4.

Figure 2:
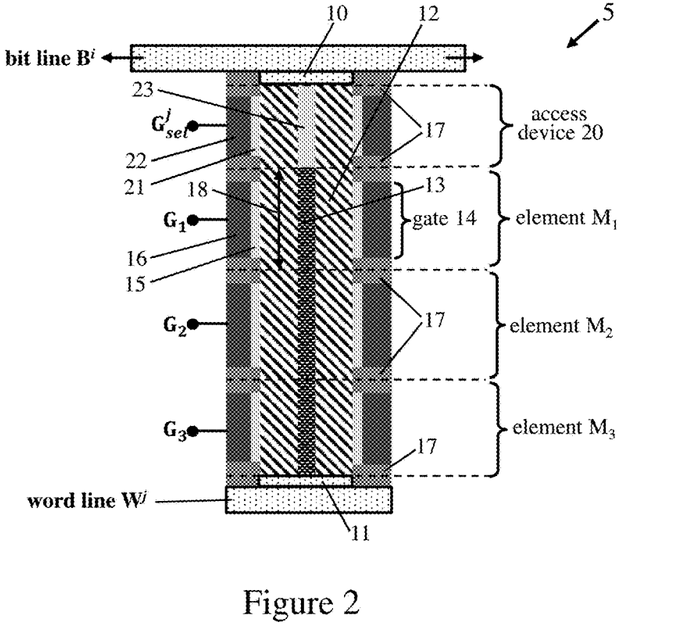
FIG. 2 illustrates structure of a PCM cell unit in the resistive memory apparatus.

FIG. 2 is a schematic cross-sectional view of a PCM cell unit 5 in a first embodiment. The cell unit 5 is arranged between first and second supply terminals formed here by ohmic contacts 10 and 11 and the adjoining regions of the bit line $B^i$ and word line $W^j$ connected to the cell unit. A variable-resistance channel component 12 extends between the two supply terminals. In this embodiment, channel component 12 contacts both supply terminals and is formed as an elongate annulus of semiconductor material. A plurality k of PCM memory elements $M_k$ are arranged along the channel component 12. In the simple example shown, k=3. Each memory element $M_1$ to $M_3$ comprises a PCM material 13 which extends along a respective segment of the channel component in contact therewith. Successive channel segments are demarcated by the dashed lines in the figure. In this embodiment, the PCM material of elements $M_1$ to $M_3$ is disposed within the annular channel component 12 and is formed as a continuous core of PCM material 13. As indicated in relation to element $M_1$ in the figure, each memory element $M_1$ to $M_3$ further comprises a gate terminal 14 provided on the respective channel segment. In this embodiment, the gate terminal 14 is located on the outer surface of the annular channel component to form a ring around the channel segment. The gate terminal comprises a gate oxide layer 15 on the surface of the channel segment and a gate electrode layer 16 overlying the gate oxide. The gate terminals (hereinafter "gates") 14 of successive memory elements are electrically isolated by intervening sections, here rings, of electrically-insulating material 17. The gates 14 of memory elements $M_1$ to $M_3$ are connected to respective control lines $G_1$ to $G_3$ of the control circuitry 3 described above. The gate 14 overlying a given channel segment operates to control resistance of that channel segment in response to control signals applied to the gate via the corresponding control line. In particular, the gate and channel segment effectively operate as a FET (field-effect transistor) whereby formation of a conductive channel along the semiconductor material of the channel segment can be controlled by application of appropriate gate voltages via the gate control line. This enables electrical resistance of the channel segment to be controlled as described below. The control area of each gate 14 extends along the entire length of the channel segment as indicated by arrow 18 for element $M_1$.

The cell unit 5 also includes an access device 20 having a control terminal connected to the control line $G_{sel}^j$ for the word line $WL^j$. The access device 20 operates to enable current-flow between the supply terminals via channel component 12 in response to word-line select signals applied via control line $G_{sel}^j$ to the control terminal. In this embodiment, the control terminal comprises a further gate terminal formed by gate oxide layer 21 and gate electrode layer 22 overlying a further segment of channel component 12 adjacent the bit-line terminal. The core of the channel segment at access-device 20 is filled with insulating material 23. Access device 20 thus forms a further FET for controlling conductivity of the channel component.

The PCM material 12 may comprise a chalcogenide compound such as GST. Alternative PCM materials include other compounds of some or all elements Ge, Ga, Sb and Te, such as $Ge_2Sb_2Te_5$, GeTe, $Ge_{15}Sb_{85}$, and GaSb for example. Such compounds may also have added constituents such as carbon, nitrogen, silicon, or silicon dioxide for instance. Other possible materials include In—Ge—Te alloys, Si—Sb—Te alloys and Si—Sb alloys. Channel component 12 may be formed of polysilicon, or other (doped or undoped) semiconductor materials such as, for example, $Si_xGe_{1-x}$ (x=0 to 1), InGaAS or other III-V semiconductors, polysilicon, amorphous silicon or amorphous Ge. Gate oxide layers 15, 21 may be formed of e.g. $SiO_2$, $Al_2O_3$, $HfO_2$, Hf-Silicates, SiON, $ZrO_2$ or multi-layer combinations of these, and insulating core 23 may be formed of e.g. silicon oxide or silicon nitride. Gate electrodes 16, 22 may be formed of e.g. doped polysilicon, doped amorphous silicon or metals such as TiN, TaN, Al and W. The gate insulating regions 17 may be formed of $SiO_2$ or SiN for example.

Figure 3:
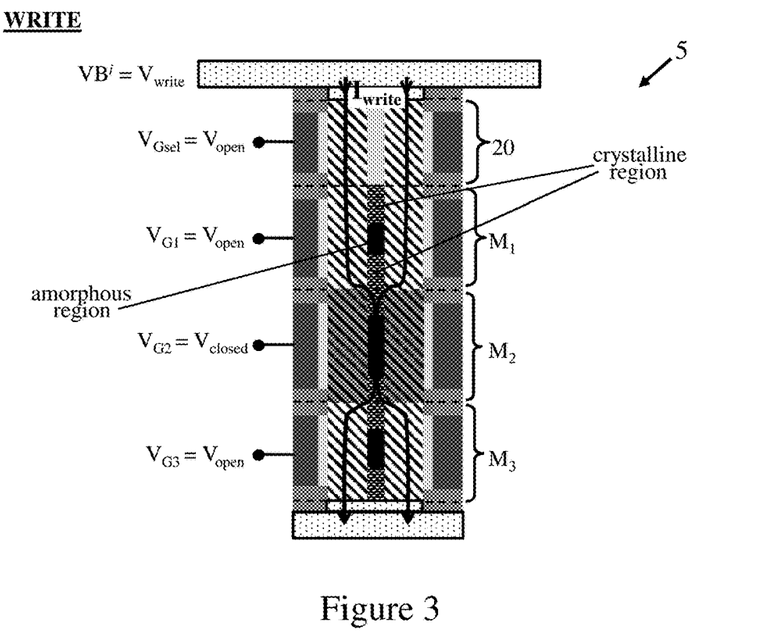
FIG. 3 indicates current flow in the FIG. 2 cell unit during a write operation.

In operation, the relative proportions of amorphous and crystalline regions in the PCM material 13 of memory elements $M_1$ to $M_3$ can be varied via programming (write) operations based on the principles described above. In particular, the respective lengths along a channel segment of amorphous and crystalline regions of the PCM material of an element can be varied in a write operation as illustrated in FIG. 3. This figure shows amorphous regions (darker shading) of differing lengths in the PCM material 13 of the elements corresponding to different programmed states. The configuration for a write operation to element $M_2$ is illustrated. A write signal is supplied to the unit by applying a write voltage $V_{write}$ above the PCM switching threshold to the bit line $BL^i$ as bit-line voltage $VB^i$. The word line $WL^j$ is held at a reference voltage level, e.g. a signal earth. The particular cell unit 5 is selected for writing by applying a select signal to the control terminal of access device 20 via control line $G_{sel}^j$. Element $M_2$ is selected for the write operation by applying a control signal on line $G_2$ which produces a channel segment having a resistance greater than that of the PCM material of the element. Each other memory element $M_1$, $M_3$ is deselected by applying a control signal on lines $G_1$, $G_3$ which produces a channel segment having a resistance less than that of the PCM material of the element. In particular, the gate voltage $V_{Gsel}$ of access device 20 is set to a voltage level "$V_{open}$" causing the channel segment at access device 20 to be fully-conductive (open). This voltage $V_{open}$ depends on particular FET operating characteristics but is typically a high gate voltage. Similarly, the gate voltages $V_{G1}$, $V_{G3}$ of elements $M_1$ and $M_3$ are set to $V_{open}$ causing the channel segments at these elements to be open. The gate voltage $V_{G2}$ of element $M_2$ is set to a voltage level "$V_{closed}$" causing the channel segment at $M_2$ to be non-conductive (closed) as indicated by darker shading in the figure. This voltage $V_{closed}$ again depends on particular FET operating characteristics but is typically 0V or a negative accumulation voltage. The resulting write current $I_{write}$ flows through the channel segments at access device 20 and elements $M_1$ and $M_3$, but through the PCM material of element $M_2$. The write operation thus effects phase-change in the PCM material of element $M_2$, whereby the length of the amorphous region in the element can be varied. In this embodiment, the resulting length of the amorphous region can be controlled by controlling one or more characteristics, e.g. amplitude, (or alternatively power, pulse duration, number of pulses) of the write signal $V_{write}$. In this way, the memory element $M_2$ can be programmed to a desired state.

Figure 4:
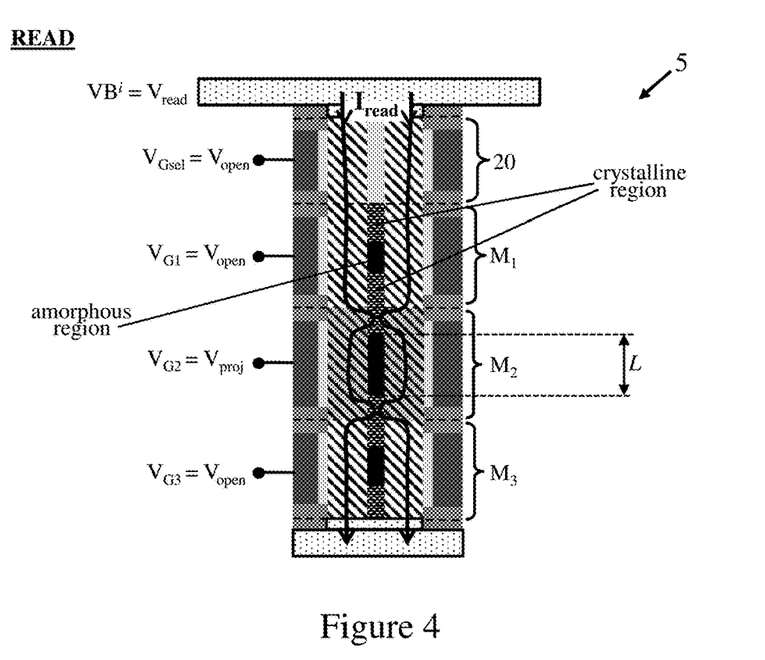
FIG. 4 indicates current flow in the FIG. 2 cell unit during a read operation.

In the write mode described above, individual memory elements $M_k$ of a cell unit 5 can be selectively programmed to one of s>2 programmable states, providing multilevel operation. The different programmable states correspond to different resistance levels determined by the length along the channel segment of the high-resistance amorphous phase in the low-resistance crystalline PCM material of the element. The programmed state can be determined from resistance measurements in the read mode as illustrated in FIG. 4. The configuration for a read operation for element $M_2$ is illustrated. A read signal is supplied to the cell unit by applying a read voltage $V_{read}$ below the PCM switching threshold to the bit line $BL^i$. The word line $WL^j$ is held at a reference voltage level, e.g. a signal earth, as before. The cell unit 5 is selected for reading by applying a select signal to access device 20 via control line $G_{sel}{}^j$. Element $M_2$ is selected for the read operation by applying a control signal on line $G_2$ which produces a channel segment having a resistance between that of the amorphous and crystalline regions of the PCM material of the element. Each other memory element $M_1$, $M_3$ is deselected by applying a control signal on lines $G_1$, $G_3$ which produces a channel segment having a resistance less than that of the low-resistance crystalline region of the element. In particular, the gate voltage $V_{Gsel}$ of access device 20 is set to $V_{open}$ causing the channel segment at access device 20 to be fully-conductive. Similarly, the gate voltages $V_{G1}$, $V_{G3}$ of elements $M_1$ and $M_3$ are set to $V_{open}$ causing the channel segments at these elements to be open. The gate voltage $V_{G2}$ of element $M_2$ is set to an intermediate voltage level "$V_{proj}$" causing the channel segment at this element to be partially-conductive as indicated by shading in the figure. The resulting resistance of the channel segment at $M_2$ is much lower than (e.g. about $\frac{1}{10}^{th}$) that of the amorphous phase of the PCM material, but still higher than that of the crystalline PCM material. The resulting read current $I_{read}$ thus flows through the channel segments at access device 20 and elements $M_1$ and $M_3$. At element $M_2$, the read current flows through the crystalline PCM material in preference to the channel segment, and through the channel segment in preference to the amorphous material.

Figure 5:
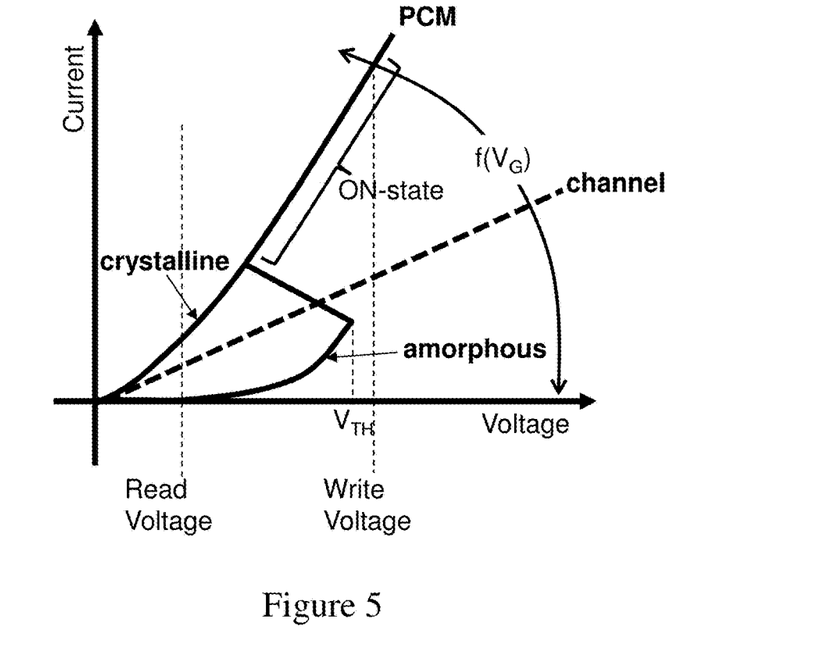
FIG. 5 is a schematic illustration of current-voltage characteristics of components of the cell unit.

The above operation can be understood from a consideration of FIG. 5 which is a schematic illustration of the current/voltage (and hence resistance) characteristics of the material components of a PCM memory element. The solid lines indicate variation of current with voltage for the PCM material of the element, starting from the SET state (upper curve) and the RESET state (lower curve). These two curves reflect the large (typically 3 orders of magnitude) variation in resistivity between the crystalline and amorphous phases. The dashed line in the plot represents the variable-resistance characteristic of the channel segment whose resistance can be varied as a function of gate voltage $V_G$ at the overlying gate terminal. It can be seen that, at low voltages including the read voltage, the resistance of the amorphous and crystalline regions is markedly different. The control voltage "$V_{proj}$" for the read operation is selected to produce a channel segment having an intermediate resistance between that of the amorphous and crystalline regions. The resulting current flow during a read operation is thus as indicated in FIG. 4. The amorphous phase exhibits a non-linear characteristic with a threshold switching phenomenon when it is field induced. At a certain threshold voltage $V_{TH}$, this phase switches to a very low "ON-state" resistance corresponding to that of the crystalline PCM material. The write voltage $V_{write}$ is selected to be above this switching threshold, enabling flow of a large write current to effect phase change as described above. At the control voltage "$V_{closed}$" for the write operation, the channel segment is non-conductive, providing a resistance higher than that of the PCM material.

With the operation described, the overall resistance of cell unit 5 to a read current $I_{read}$ depends on the length L of the amorphous region in the selected memory element (and hence on the programmed state of that element) as indicated in FIG. 4. The resulting read current $I_{read}$ thus depends on the programmed state of the selected element in the read mode. However, the read current does not flow through the amorphous region of the memory element. The length L is effectively projected onto the channel segment via the current path through the unit in the read mode. The R/W controller 4 measures the read current and compares this with predefined ranges, corresponding to the different programming levels, to determine the programmed state of the element. Since the read measurement depends primarily on resistance of the channel segment at the selected element, and not on resistance of the amorphous phase of the element, the different programmed states can be detected with high accuracy, providing reliable multilevel operation.

The embodiment described provides a highly efficient cell-unit structure in which multilevel memory elements can be written and read using the common channel component both for selection/deselection of elements, and also for projection of read measurements for reliable multilevel operation. The structure described can be readily fabricated in an integrated array to provide an efficient 3D memory architecture described further below. Experiments show that at least 3 bits can be stored in individual memory elements. Hence, for any number of layers in a 3D architecture, storage capacity is expected at least to triple compared with single-level devices. Moreover, the number of layers (corresponding to the number of memory elements k in each unit) is constructed at the FEOL processing stage and is not subject to limitations applying to BEOL-based 3D architectures. While k=3 in the simple example above, in practice k may be significantly greater and can be anticipated to match, or even exceed, the 24 to 48 layers of current 3D flash memory architectures.

Various alternatives to operating modes can be envisaged. For example, programming operations are effected by controlling characteristics of the write signal $V_{write}$ in the above example. In other embodiments, R/W controller 4 may modulate the control signal applied to the gate of the memory element to be programmed in the write mode. In FIG. 4, for instance, $V_{G2}$ may be pulsed between $V_{closed}$ and $V_{open}$, with the pulse duration or number of fixed-duration pulses being varied for programming control. As another example, R/W controller 4 may control at least one characteristic of the select signal applied to the gate of access device 20 to effect programming control. For example, the gate voltage $V_{Gsel}$ may be selected so as to control conductivity of the channel and hence limit the write current flowing through the selected memory element. One or a combination of these techniques may be used for overall programming control.

Figure 6:
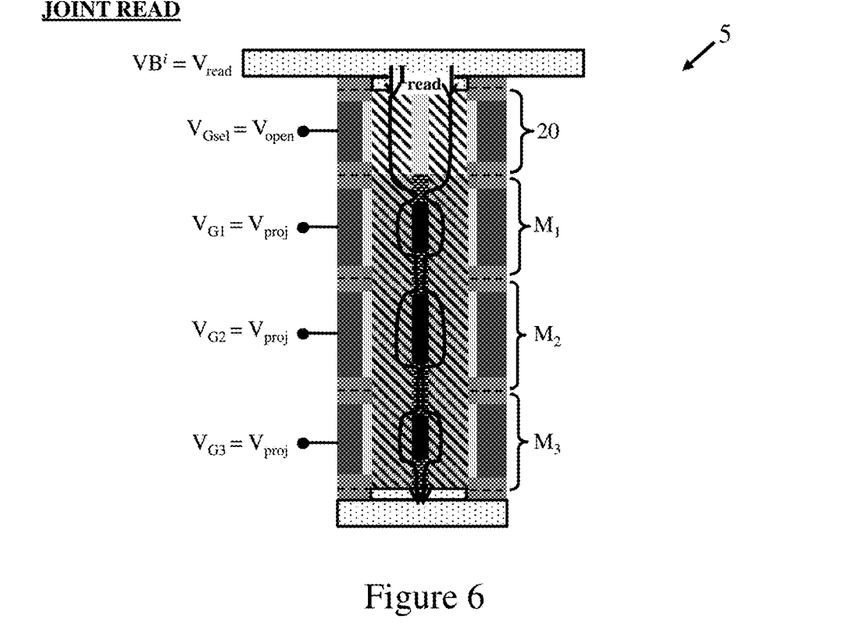
FIG. 6 illustrates an alternative read mode operation for a PCM cell unit.

In the read mode above, the R/W controller selects one memory element at any time for a read operation. For example, the k memory elements of a given cell unit may be read sequentially. The memory elements $M_k$ thus correspond to respective memory cells which can be programmed and read individually, providing maximum storage density advantage. An alternative "joint read" mode, in which R/W controller 4 selects all memory elements $M_k$ in the cell unit simultaneously, is illustrated in FIG. 6. Here, the gate voltage $V_{Gsel}$ of access device 20 is set to $V_{open}$ as before, but gate voltages $V_{Gk}$ of all elements $M_k$ are set to $V_{proj}$. The read current thus flows through the crystalline regions of all memory elements, bypassing the amorphous regions via the corresponding channel segments as indicated. The resulting read measurement thus depends on the programmed state of all k memory elements. With this joint read mode, cell unit 5 effectively corresponds to a single memory cell with multiple programming levels corresponding to different combinations of programmed states of the individual memory elements $M_k$. This provides a fast read operation, since all elements are read together, and significantly increased programming range (state space) because many more programming levels can be defined within the total resistance range of the k elements. As a trade-off, overall storage capacity will be less than with individual read operation of multilevel elements.

Figure 7:
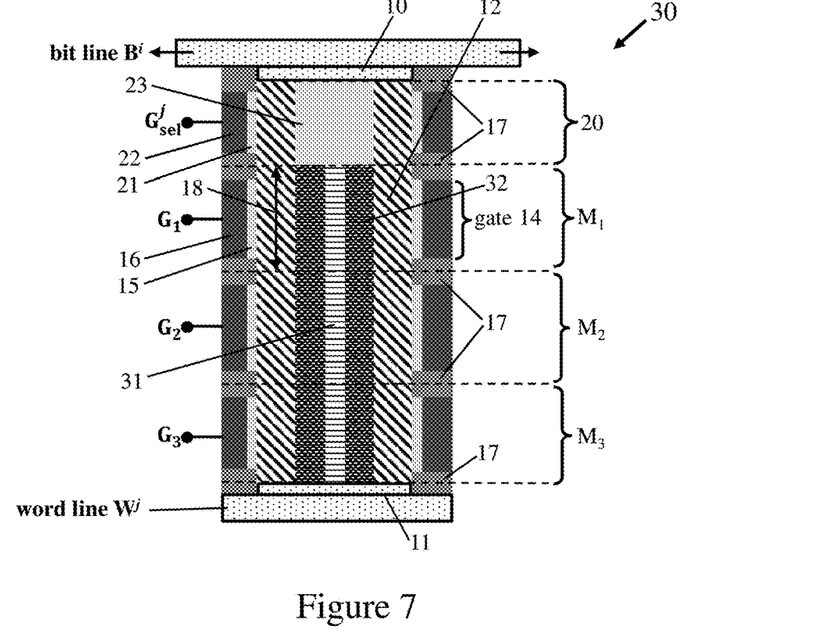
FIG. 7 illustrates structure of a second embodiment of a PCM cell unit.
Figure 8:
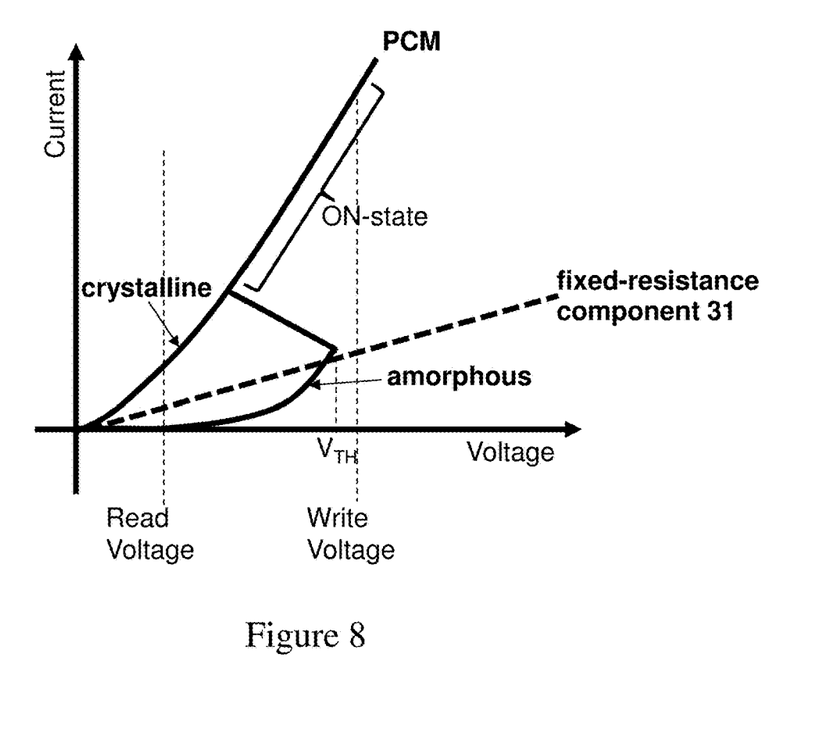
FIG. 8 is a schematic illustration of current-voltage characteristics of components of the FIG. 7 cell unit.
Figure 9:
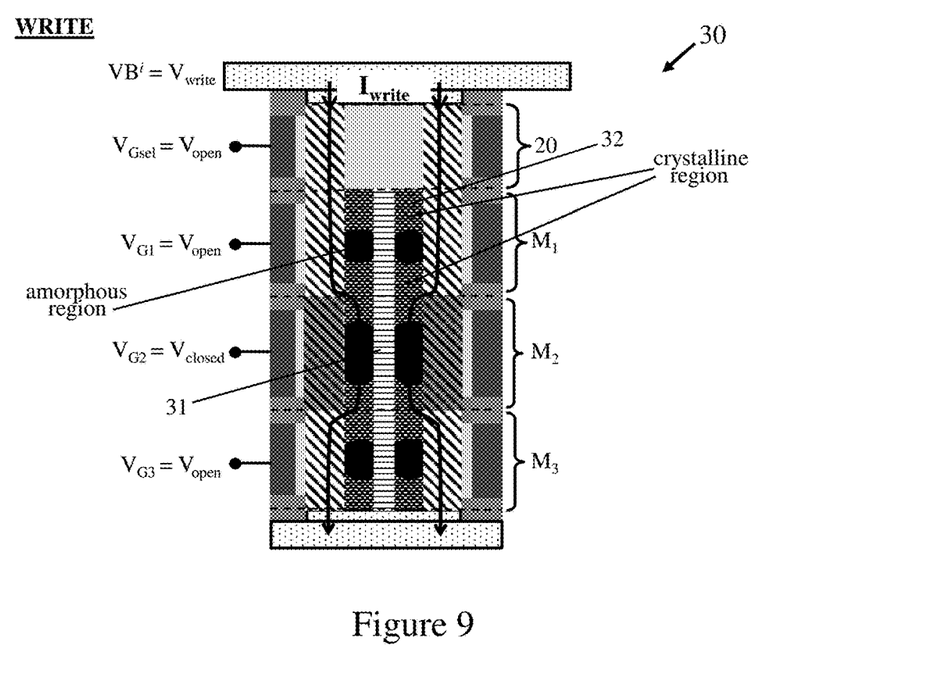
FIG. 9 indicates current flow in the FIG. 7 cell unit during a write operation.
Figure 10:
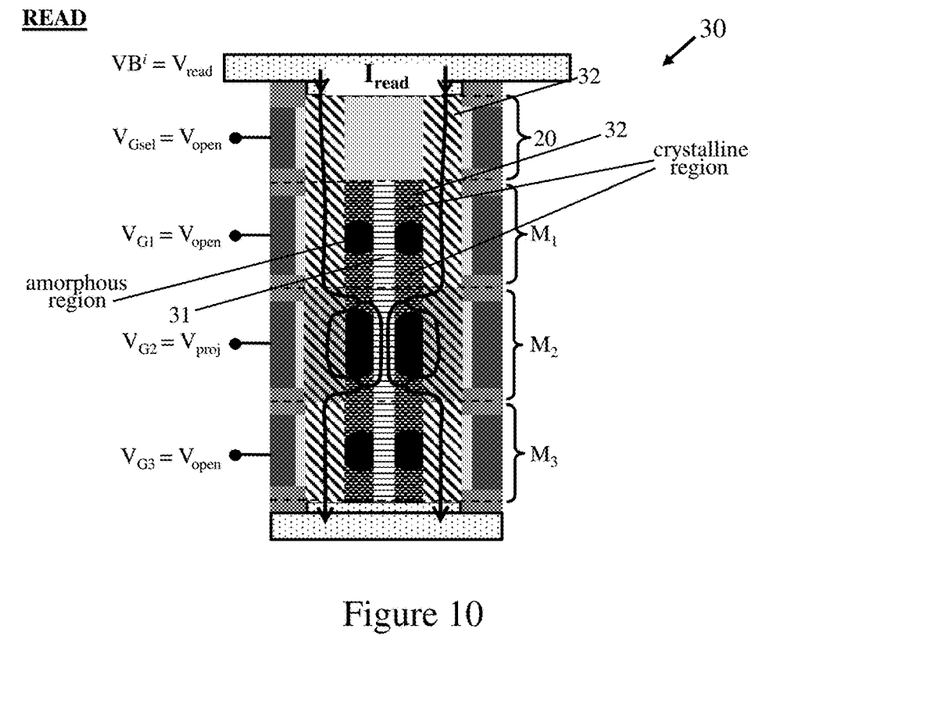
FIG. 10 indicates current flow in the FIG. 7 cell unit during a read operation.

FIG. 7 is a schematic cross-sectional view of a second embodiment of a PCM cell unit. The cell unit 30 of this embodiment corresponds generally to that of FIG. 4, and corresponding components are indicated by like reference numerals. Each memory element $M_k$ here includes a fixed-resistance component 31 extending along the respective channel segment in contact with the PCM material 32 on an opposite surface of the PCM material to the channel segment. In this example, the fixed-resistance component 31 is formed as a continuous core component and the PCM material 32 forms an annulus around the core component 31. The core component 31 is a moderate conductor which may be formed, for example, of a metal nitride or a doped semiconductor such as doped polysilicon. The material is selected such that core component 31 has a resistance which is between that of the amorphous and crystalline regions of the PCM material at the read voltage $V_{read}$ as illustrated schematically in FIG. 8. Core component 31 thus provides a further "projection component" for the read operation. However, presence of the core component does not affect write operations because the fixed-resistance of the core will be greater than that of the PCM material in the write mode due to the threshold switching effect explained above. The path of write current $I_{write}$ in a write operation is thus as shown in FIG. 9 for selected element $M_2$. The path of read current $I_{read}$ in the "individual read" mode is thus as shown in FIG. 10 for selected element $M_2$.

The use of core component 31 as an additional projection component allows characteristics of memory elements to be tailored. For example, presence of the core may facilitate provision of a thin PCM layer 32. Reduced dimensions of the PCM layer may in turn enhance resolution of programming levels, facilitating read detection. The core component material can be selected to give desired electrical properties for the read operation, e.g. lower current noise and lower temperature dependence of resistance than the channel component, to further enhance read accuracy and promote efficient read operation, e.g. through reduced read complexity and/or higher read speed. Also, resistive properties of the core may be varied along its length during fabrication. For example, resistivity of the core material may be varied along its length, e.g. by varying doping levels in a semiconductor core material, or by varying geometry (e.g. width) of the core. Such resistance variation will be reflected in read measurements for different programmed states, allowing programming characteristics to be tailored, e.g. for enhanced level resolution and/or improved programming range.

Figure 11:
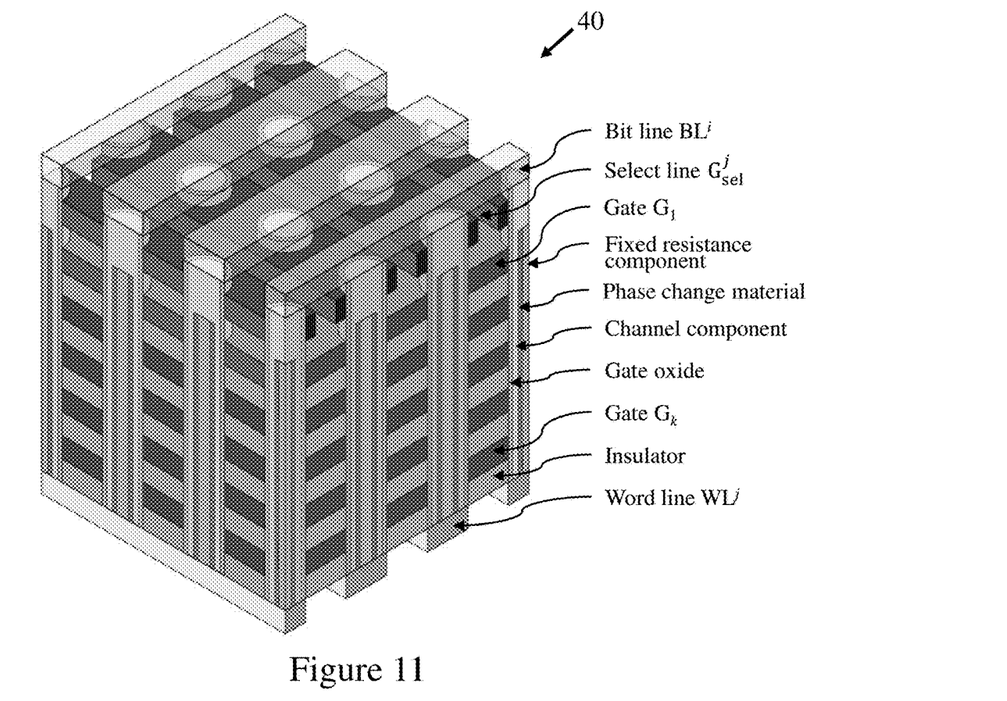
FIG. 11 is a schematic illustration of an array of PCM cell units forming an integrated 3D memory structure.

The above embodiments provide efficient structures for fabrication of integrated 3D memory architectures. An example based on the FIG. 7 cell unit is illustrated schematically in FIG. 11. This cross-sectional view shows a section of an integrated memory array 40 illustrating the 3D structure. The example shown has k=5 layers of memory elements, though many more layers may be provided as discussed above. A memory device may also include several such array structures, arranged one above the other, subject to constraints on BEOL processing stages.

Figure 12:
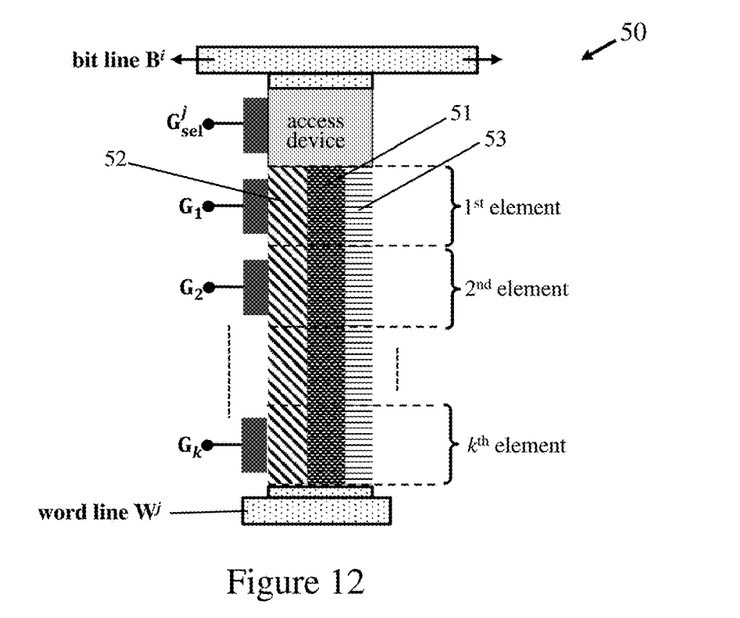
FIG. 12 indicates structure of a fourth embodiment of a PCM cell unit.

While generally cylindrical cell unit structures are described above, various alternatives can be envisaged. By way of example, a "lateral" cell unit structure with components configured as overlying planar layers is illustrated schematically in FIG. 12. The k elements of this cell unit 50 comprise a layer of PCM material 51 sandwiched between a semiconductor layer 52, providing the channel component, and a layer 53 of fixed-resistance material providing an additional projection component. The control gates and access device are indicated schematically in this figure. However, channel component 52 may extend to contact bit line $B^i$, and gates may be constructed from planar gate oxide and electrode layers as before, whereby functional operation is generally as described above.

Any of the cell units described may be operated in joint-read or individual-read modes as desired. Many other changes and modifications can of course be made to the exemplary embodiments described. In a modification to the FIG. 7 structure, for example, core component 31 may be formed of electrically-insulating material whereby the additional projection effect of the core component is omitted and the channel component provides the sole projection mechanism.

Cell units may be constructed with other than circular cross sections or flat planar layer structures if desired. The PCM material of different memory elements may not be continuous along the extent of the channel component in some embodiments. While cell units are based on PCM cells in the examples above, different resistive memory elements may be used in other embodiments. Some examples include resistive RAM (RRAM) cells such as conductive bridge RRAM cells, oxide or metal-oxide RRAM cells, and carbon RRAM cells.

The access device in a cell unit could be disposed at other positions along the channel component between the supply terminals, and different access devices may be employed in other embodiments. Examples include double-gate MOS (metal oxide semiconductor) devices and ovonic threshold switches. Also, while use of access devices inhibits leakage currents in adjacent units of a multi-unit device, arrangements might be envisaged in which access devices are not required. Various other gate structures can also be envisaged as will be apparent to those skilled in the art.

According to at least one embodiment, a resistive memory apparatus is provided. The apparatus may include at least one memory cell unit comprising a variable-resistance channel component extending between first and second supply terminals for supplying read and write signals to the unit in respective read and write modes. The memory cell unit may include a plurality of resistive memory elements which are arranged along the channel component. Each memory element may include a resistive memory material, extending along a respective segment of the channel component in contact therewith, in which respective lengths along that channel segment of high- and low-resistance regions of the material can be varied in the write mode, and a gate terminal provided on that channel segment for controlling resistance of the channel segment in response to control signals applied to the gate terminal. The apparatus may further includes control circuitry for applying the aforementioned signals to the gate and supply terminals in the read and write modes. The control circuitry may be operable such that, in the read mode, at least one memory element is selected by applying to that element a control signal which produces a channel segment having a resistance between that of the high- and low-resistance regions of the resistive memory material of the element. Also, any remaining memory element may be deselected by applying to that element a control signal which produces a channel segment having a resistance less than that of the low-resistance region of the resistive memory material of the element.

According to some embodiments, resistance of segments of the channel component may be controlled so that the channel component, which is common to all memory elements in the unit, can be used both to select elements for read operations and also may be used to provide a "projection effect" for enhancing accuracy of resistance measurements in the read mode. In particular, for a selected element in the read mode, the read current may flow through the channel segment in preference to the high-resistance region of the element, and through the low-resistance region of the element in preference to the channel segment. For deselected elements, the read current may flow through the channel segment in preference to the resistive memory material of the element. The resistance of the unit may be a read current thus depends on the length of the high-resistance region in the selected memory element (and hence on the programmed state of that element), but the read current does not flow through the high-resistance region of the element. The length of this high-resistance region may be effectively "projected" onto the channel for the read operation. This may mitigate problems associated with noise and resistance variations in the resistive memory material, offering enhanced accuracy in read measurements. This in turn may permit multi-level operation of individual memory elements because the different programmed states can be detected with greater accuracy. Embodiments described herein provide the basis for highly-efficient resistive memory architectures.

The control circuitry may be further operable in the write mode to program a selected memory element by: applying to the selected memory element a control signal which produces a channel segment having a resistance greater than that of the resistive memory material of the element; and applying to each other memory element a control signal which produces a channel segment having a resistance less than that of the resistive memory material of the element. Since a write signal is applied to the supply terminals in the write mode, the length of the high-resistance region in the resistive memory material of the selected element may be programmed to a desired level. The control signals may thus additionally be used to control the channel for selection and deselection of elements for write operations. The particular programming level resulting from a write operation may be controlled in various ways discussed below.

In some embodiments, the control circuitry may be operable in the read mode to select all memory elements simultaneously. Here, a memory cell unit effectively corresponds to a memory cell with multiple levels corresponding to different combinations of programmed states of the individual memory elements. This trades-off storage density for significantly enhanced programming range, and provides fast read mode operation. In other embodiments, the control circuitry is operable in the read mode to select one memory element at any time. In this case, the memory elements may correspond to respective memory cells which may be programmed and read individually. This offers maximum storage density advantage.

According to some embodiments, the apparatus may include a plurality of memory cell units. These may be formed as an integrated array of memory cell units arranged in rows and columns. This provides a highly efficient 3D architecture based on FEOL (front end of line) processing. The number of layers (corresponding to the number of memory elements in each unit) is not limited as in prior BEOL-based structures. Moreover, the multilevel cells of each layer increase storage density by a factor equal to the number of bits that can be stored in each cell.

Each memory cell unit preferably includes an access device, comprising a control terminal, disposed between the supply terminals for enabling current-flow between the supply terminals via the channel component in response to select signals applied to the control terminal. The control circuitry may be further operable to apply such a select signal to the control terminal of a selected memory cell unit in the read and write modes. Such an access device allows selection of a unit for read and write operations, e.g. via shared supply lines, while inhibiting leakage currents in a multi-unit apparatus. In a particularly convenient structure, the channel component contacts the first and second supply terminals and the control terminal comprises a further gate terminal provided on a further segment of the channel component.

In some embodiments, each memory element may include a fixed-resistance component extending along the respective channel segment in contact with the resistive memory material of the element on an opposite surface of the material to the channel segment. Resistance of the fixed-resistance component may be between that of the high- and low-resistance regions of the resistive memory material of the element in the read mode. Such a fixed-resistance component thus acts as an additional "projection component" for the read operation. However, this component does not affect write operations because resistance of the component will be greater than that of the resistive memory material in the write mode due to a threshold switching property of resistive memory material explained below. Such an additional projection component may provide various advantages such as tailoring of device characteristics and enhanced readback-level resolution as discussed further below.

In preferred embodiments, the channel component may include an elongate annulus, the resistive memory material of each memory element is disposed within the annulus, and the gate terminal of each memory element is provided on an outer surface of the annulus. Each memory element may include a core component (which may provide the aforementioned fixed-resistance component), with the resistive memory material of the element forming an annulus around the core component. These arrangements provide highly efficient structures which can be readily fabricated as an integrated array.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
   at least one memory cell comprising:
      a variable-resistance channel component extending between first and second supply terminals for supplying read and write signals to the memory cell in respective read and write modes, and
      a plurality of resistive memory elements arranged along the channel component, wherein each memory element comprises a resistive memory material, extending along a respective channel segment of the channel component in contact therewith, in which respective lengths of high- and low-resistance regions of the material is variable along the respective channel segment in said write mode, and a gate terminal provided on the respective channel segment for controlling resistance of the respective channel segment in response to control signals applied to the gate terminal; and
   control circuitry configured to apply said control signals to the gate and supply terminals in said read and write modes, the control circuitry configured to, in the read mode:
      select at least one memory element of the plurality of resistive memory elements by applying to the at least one element one of the control signals to produce a channel segment having a resistance between that of said high- and low-resistance regions of the resistive memory material of the at least one memory element, and each of the remaining memory elements of the plurality of resistive memory elements is deselected by applying to each of the remaining elements one of the control signals to produce a channel segment having a resistance less than that of said low-resistance region of the resistive memory material of each of the remaining elements;
   wherein the control circuitry is configured to in the write mode to program a selected memory element by:
      applying to the selected memory element one of the control signals to cause the channel segment of the selected memory element to have a resistance greater than that of the resistive memory material of the selected memory element; and
      applying to each of the other memory elements one of the control signals to cause the channel segment of each of the other memory elements to have a resistance less than that of the resistive memory material of each of the other memory elements;
      whereby said length of the high-resistance region in the resistive memory material of the selected element is programmed to a desired level; and
      wherein the control circuitry is operable in the read mode to select all memory elements simultaneously.

2. The apparatus as claimed in claim 1, wherein the control circuitry is operable in the read mode to select one memory element at any time.

3. The apparatus as claimed in claim 1, wherein the control circuitry is further configured to, in the write mode, control at least one characteristic of said write signal to control said length of the high-resistance region in the selected memory element.

4. The apparatus as claimed in claim 1, wherein the control circuitry is further configured to in the write mode to modulate the control signal applied to the selected memory element to control said length of the high-resistance region in the selected memory element.

5. The apparatus as claimed in claim 1, including a plurality of said memory cells, wherein:
   each memory cell includes an access device, comprising a control terminal, disposed between said supply terminals for enabling current-flow between the supply terminals via the channel component in response to select signals applied to said control terminal; and
   the control circuitry is further configured to apply one of the select signals to said control terminal of a selected memory cell in said read and write modes.

6. The apparatus as claimed in claim 5, wherein the channel component contacts the first and second supply terminals and said control terminal comprises a further gate terminal provided on a further segment of the channel component.

7. The apparatus as claimed in claim 5, wherein the control circuitry is further configured to in the write mode to control at least one characteristic of the select signal applied to the control terminal of the selected memory cell to control said length of said high-resistance region in the selected memory element.

8. The apparatus as claimed in claim 1, wherein each memory element includes a fixed-resistance component extending along said respective channel segment in contact with the resistive memory material of the memory elements on an opposite surface of the material to the channel segment, and wherein resistance of the fixed-resistance component is between that of said high- and low-resistance regions of the resistive memory material of the element in the read mode.

9. The apparatus as claimed in claim 1, wherein the channel component comprises an elongate annulus, the resistive memory material of each memory element is disposed within the annulus, and the gate terminal of each memory element is provided on an outer surface of the annulus.

10. The apparatus as claimed in claim 1, wherein each memory element includes a core component and the resistive memory material of the element forms an annulus around the core component.

11. The apparatus as claimed in claim 10, wherein said core component is formed of electrically-insulating material.

12. The apparatus as claimed in claim 10, wherein said core component provides a fixed-resistance component having a resistance between that of said high- and low-resistance regions of the resistive memory material of the element in the read mode.

13. The apparatus as claimed in claim 1, wherein the resistive memory material of each memory element comprises a phase-change memory material, said high- and low-resistance regions comprising amorphous and crystalline phases respectively of the material.

14. The apparatus as claimed in claim 1, wherein said memory cell comprises at least three resistive memory elements.

15. The apparatus as claimed in claim 5, wherein said plurality of memory cells are formed as an integrated array of memory cells arranged in rows and columns.

16. The apparatus as claimed in claim 15, wherein each memory cell comprises at least three resistive memory elements and wherein the resistive memory material of each element comprises a phase-change memory material, said high- and low-resistance regions comprising amorphous and crystalline phases respectively of the material.

17. An apparatus comprising:
at least one memory cell comprising:
a variable-resistance channel component extending between first and second supply terminals for supplying read and write signals to the memory cell in respective read and write modes, and
a plurality of resistive memory elements arranged along the channel component, wherein each memory element comprises a resistive memory material, extending along a respective channel segment of the channel component in contact therewith, in which respective lengths of high- and low-resistance regions of the material is variable along the respective channel segment in said write mode, and a gate terminal provided on the respective channel segment for controlling resistance of the respective channel segment in response to control signals applied to the gate terminal; and
control circuitry configured to apply said control signals to the gate and supply terminals in said read and write modes, the control circuitry configured to, in the read mode:
select at least one memory element of the plurality of resistive memory elements by applying to the at least one element one of the control signals to produce a channel segment having a resistance between that of said high- and low-resistance regions of the resistive memory material of the at least one memory element, and each of the remaining memory elements of the plurality of resistive memory elements is deselected by applying to each of the remaining elements one of the control signals to produce a channel segment having a resistance less than that of said low-resistance region of the resistive memory material of each of the remaining elements;
wherein the control circuitry is configured to in the write mode to program a selected memory element by:
applying to the selected memory element one of the control signals to cause the channel segment of the selected memory element to have a resistance greater than that of the resistive memory material of the selected memory element; and
applying to each of the other memory elements one of the control signals to cause the channel segment of each of the other memory elements to have a resistance less than that of the resistive memory material of each of the other memory elements;
whereby said length of the high-resistance region in the resistive memory material of the selected element is programmed to a desired level; and
wherein each memory element includes a fixed-resistance component extending along said respective channel segment in contact with the resistive memory material of the memory elements on an opposite surface of the material to the channel segment, and wherein resistance of the fixed-resistance component is between that of said high- and low-resistance regions of the resistive memory material of the element in the read mode.

18. An apparatus comprising:
at least one memory cell comprising:
a variable-resistance channel component extending between first and second supply terminals for supplying read and write signals to the memory cell in respective read and write modes, and
a plurality of resistive memory elements arranged along the channel component, wherein each memory element comprises a resistive memory material, extending along a respective channel segment of the channel component in contact therewith, in which respective lengths of high- and low-resistance regions of the material is variable along the respective channel segment in said write mode, and a gate terminal provided on the respective channel segment for controlling resistance of the respective channel segment in response to control signals applied to the gate terminal; and
control circuitry configured to apply said control signals to the gate and supply terminals in said read and write modes, the control circuitry configured to, in the read mode:
select at least one memory element of the plurality of resistive memory elements by applying to the at least one element one of the control signals to produce a channel segment having a resistance between that of said high- and low-resistance regions of the resistive memory material of the at least one memory element, and each of the remaining memory elements of the plurality of resistive memory elements is deselected by applying to each of the remaining elements one of the control signals to produce a channel segment having a resistance less than that of said low-resistance region of the resistive memory material of each of the remaining elements;
wherein the control circuitry is configured to in the write mode to program a selected memory element by:
applying to the selected memory element one of the control signals to cause the channel segment of the selected memory element to have a resistance greater than that of the resistive memory material of the selected memory element; and
applying to each of the other memory elements one of the control signals to cause the channel segment of each of the other memory elements to have a resistance less than that of the resistive memory material of each of the other memory elements;
whereby said length of the high-resistance region in the resistive memory material of the selected element is programmed to a desired level; and
wherein each memory element includes a core component and the resistive memory material of the element forms an annulus around the core component; and
wherein said core component provides a fixed-resistance component having a resistance between that of said high- and low-resistance regions of the resistive memory material of the element in the read mode.

\* \* \* \* \*